(12) United States Patent
Hartz et al.

(10) Patent No.: US 11,715,511 B2
(45) Date of Patent: Aug. 1, 2023

(54) TRIM LEVEL ADJUSTMENTS FOR MEMORY BASED ON DATA USE

(71) Applicant: Micron Technology, Inc., Boise, ID (US)

(72) Inventors: Ezra E. Hartz, Boise, ID (US); Joseph A. De La Cerda, Boise, ID (US); Nicolas Soberanes, Boise, ID (US); Christopher Moore, Redwood City, CA (US); Bruce J. Ford, Meridian, ID (US); Benjamin Rivera, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 17 days.

(21) Appl. No.: 17/558,099

(22) Filed: Dec. 21, 2021

(65) Prior Publication Data

US 2023/0197137 A1    Jun. 22, 2023

(51) Int. Cl.
| | | |
|---|---|---|
| *G11C 11/406* | (2006.01) | |
| *G11C 11/54* | (2006.01) | |
| *G11C 11/4096* | (2006.01) | |

(52) U.S. Cl.
CPC .... *G11C 11/40622* (2013.01); *G11C 11/4096* (2013.01); *G11C 11/40615* (2013.01); *G11C 11/54* (2013.01); *G11C 2211/4062* (2013.01)

(58) Field of Classification Search
CPC .................................................. G11C 11/406
USPC ............................................................ 365/222
See application file for complete search history.

(56) References Cited

U.S. PATENT DOCUMENTS

| | | | |
|---|---|---|---|
| 7,359,255 B2 | 4/2008 | Kimura | |
| 7,552,273 B2 * | 6/2009 | Otterstedt | G11C 16/3431 365/185.02 |
| 10,102,896 B2 | 10/2018 | Jam | |
| 11,456,051 B1 * | 9/2022 | Besinga | G11C 16/10 |
| 2008/0259708 A1 * | 10/2008 | Tsukazaki | G11C 16/3418 365/222 |
| 2009/0033306 A1 | 2/2009 | Tanzawa | |
| 2016/0189801 A1 * | 6/2016 | Yamaguchi | G11C 11/406 365/200 |

* cited by examiner

*Primary Examiner* — Muna A Techane
(74) *Attorney, Agent, or Firm* — Brooks, Cameron & Huebsch, PLLC

(57) ABSTRACT

A method includes determining a quantity of refresh operations performed on a block of a memory device of a memory sub-system and determining a quantity of write operations and a quantity of read operations performed to the block. The method also includes determining the block is read dominant using the quantity of write operations and the quantity of read operations and determining whether the quantity of refresh operations has met a criteria. The method further includes, responsive to determining that the block is read dominant and that the quantity of refresh operations has met the criteria, modifying trim settings used to operate the block of the memory device.

24 Claims, 7 Drawing Sheets

TRIM LEVEL ADJUSTMENTS FOR MEMORY BASED ON DATA USE

TECHNICAL FIELD

Embodiments of the disclosure relate generally to memory sub-systems, and more specifically, relate to adjusting trim levels in memory based on data use.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
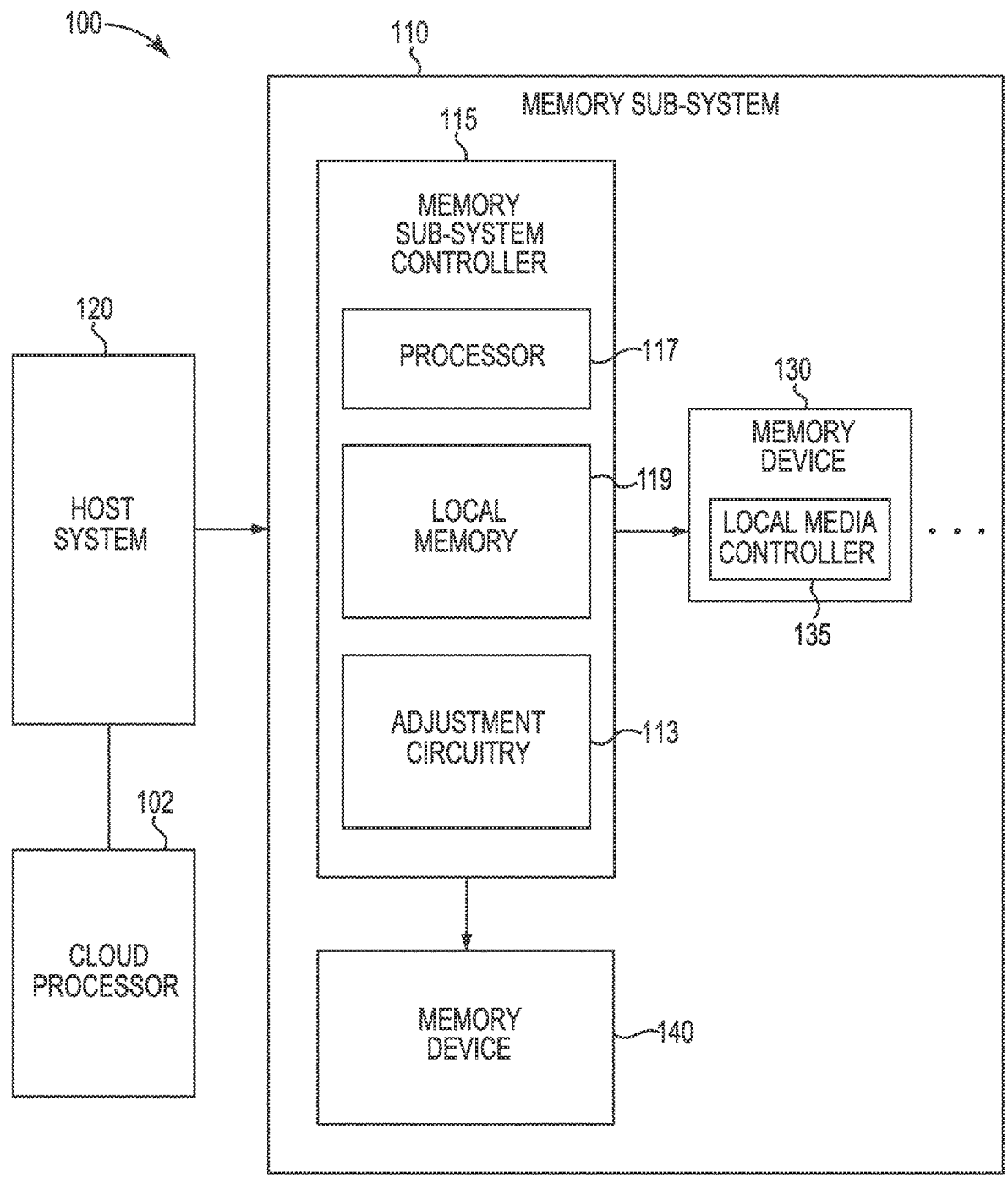
FIG. 1 illustrates an example computing system that includes a memory sub-system in accordance with some embodiments of the present disclosure.

Aspects of the present disclosure are directed to adjusting trim levels in memory based on data use, in particular to memory sub-systems that include adjustment circuitry to adjust trim levels of the memory. A memory sub-system can be a storage system, storage device, a memory module, or a combination of such. An example of a memory sub-system is a storage system such as a solid-state drive (SSD). Examples of storage devices and memory modules are described below in conjunction with FIG. 1, et alibi. In general, a host system can utilize a memory sub-system that includes one or more components, such as memory devices that store data. The host system can provide data to be stored at the memory sub-system and can request data to be retrieved from the memory sub-system.

A memory device can be a non-volatile memory device. One example of non-volatile memory devices is a negative-and (NAND) memory device (also known as flash technology). Other examples of non-volatile memory devices are described below in conjunction with FIG. 1. A non-volatile memory device is a package of one or more dice. Each die can consist of one or more planes. Planes can be groups into logic units (LUN). For some types of non-volatile memory devices (e.g., NAND devices), each plane consists of a set of physical blocks. Each block consists of a set of pages. Each page consists of a set of memory cells ("cells"). A cell is an electronic circuit that stores information. A block hereinafter refers to a unit of the memory device used to store data and can include a group of memory cells, a word line group, a word line, or individual memory cells. For some memory devices, blocks (also hereinafter referred to as "memory blocks") are the smallest area than can be erased. Pages cannot be erased individually, and only whole blocks can be erased.

Each of the memory devices can include one or more arrays of memory cells. Depending on the cell type, a cell can store one or more bits of binary information, and has various logic states that correlate to the number of bits being stored. The logic states can be represented by binary values, such as "0" and "1", or combinations of such values. There are various types of cells, such as single level cells (SLCs), multi-level cells (MLCs), triple level cells (TLCs), and quad-level cells (QLCs). For example, a SLC can store one bit of information and has two logic states.

Some NAND memory devices employ a floating-gate architecture in which memory accesses are controlled based on a relative voltage change between the bit line and the word lines. Other examples of NAND memory devices can employ a replacement-gate architecture that can include the use of word line layouts that can allow for charges corresponding to data values to be trapped within memory cells based on properties of the materials used to construct the word lines.

Blocks of a memory device that are read frequently but are written to infrequently can have unique properties. For example, blocks that are read frequently but are written to infrequently can have lower read disturb rates and retention rates as compared to blocks that are frequently written to. Given the lower read disturb rates, the blocks can be cycled needlessly which can contribute to the life expectancy of the blocks and/or the memory device. As used herein, a cycle of memory cells of a block of a memory device can describe a programming of the memory cells. The life expectancy of a block and/or a memory device describes an expected quantity of cycles of the memory cells of the block and/or the memory device that the memory device supports before the memory device is expected to fail.

Aspects of the present disclosure address the above and other deficiencies by adjusting trim levels of memory based on a use of the memory cells of a block of the memory device. The trim levels can be adjusted based on the block of a memory device being written to infrequently and being read frequently. Utilizing trim levels to lower the quantity of refresh operations utilized over a period of time can extend the life of a memory device that is written to infrequently and read frequently.

As used herein, the expression "written to infrequently" and "read frequently" describes a use of a block of a memory device where the block is read dominant. A block that is read dominant describes a block that is written to infrequently and read frequently. The terms frequently and infrequently can be utilized in relation to a threshold. For example, a block can be written to infrequently if the quantity of write operations to the block during a period of time is less than a threshold. A block can be read frequently if the quantity of read operations to the block during the period of time is greater than a different threshold. In various instances, the terms "frequently" and "infrequently" can be utilized to describe a relationship between write operations and read operations. The relationship between write operations and read operations can be defined using multiples. For example, if read operations are performed three times more than write operations are performed on a block of a memory device, then the writes to the block can be labeled as "infrequent" while the reads to the block are labeled as "frequent". However other multipliers can be used to describe the relationship between write operations and read operations.

The trim setting of the block of a memory device can be modified responsive to identifying a block of the memory device as read dominant and to identifying the block as having too low of an occurrence of read disturb and/or a time retention of the block. Read disturb and time retention are further described in association with FIG. 1, 2, 3.

As used herein, trim levels can include pulse magnitude, step size, pulse duration, program verify voltages, and/or read voltages, among other possible trim levels. For instance, trim levels, used to operate (e.g., program) the memory devices, can be used to modify a read window budget (RWB). An RWB can refer to cumulative value (e.g., in voltage) of a number of distances (e.g., in voltage) between adjacent threshold voltage distributions at a particular bit error rate (BER). Such characteristics include pulse magnitude, step size between pulses (e.g., program step size), and/or pulse duration (e.g., program step duration), among various other characteristics.

As used herein, a program step size can be referred to as a voltage difference between successive voltage pulses, and a program step duration can be referred to as a duration for which a voltage pulse is applied. In relation to program step duration, in at least one example, program step duration can be measured by counting clock cycles of a known frequency between a time a program command was issued to a memory (e.g., NAND) and when the memory programming operation is complete. In another example, the program step duration can be measured by using a. number of program pulses used to complete the memory program operation and apply a known amount of time for each pulse.

A read window, which may be referred to as a read window width, refers to a distance (e.g., in voltage) between adjacent threshold voltage (Vt) distributions at a particular bit error rate. A read window may also be referred to as a "valley margin" since the Vt distributions include respective peaks with the regions therebetween being referred to as valleys. The RWB can refer to a cumulative value of read windows for a group of programmed cells (e.g., one or more pages of cells). For example, cells configured to store three bits of data per cell may be programmed to one of eight different Vt distributions, each corresponding to a respective data state. The RWB can he the cumulative value (e.g., in voltage) of the seven read windows between the eight Vt distributions. The RWB corresponding to a group of memory cells is affected by various factors such as temperature, wear cycling (e.g., program/erase cycles), etc. Therefore, the RWB(s) of a system can vary over time, which can affect system quality of service (QoS), reliability, and/or performance. In various instances, it can be beneficial to maintain a specified RWB in order to maintain a particular system characteristic (e.g., QoS, error rate, etc.) across various environmental conditions and/or user workloads. However, it can also be beneficial to provide the ability to dynamically adjust an RWB (e.g., to a target value) in order to change one or more system characteristics.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, server, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, and the like.

The host system 120 can include a processor chipset and a software stack executed by the processor chipset. The processor chipset can include one or more cores, one or more caches, a memory controller (e.g., an SSD controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random-access memory (DRAM) and synchronous dynamic random access memory (SDRAM).

Some examples of non-volatile memory devices (e.g., memory device 130) include negative-and (NAND) type flash memory and write-in-place memory, such as three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130, 140 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLC) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as three-dimensional cross-point arrays of non-volatile memory cells and NAND type memory (e.g., 2D NAND, 3D NAND) are described, the memory device 130 can be based on any other type of non-volatile memory or storage device, such as such as, read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

The memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., a processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory device 130 and/or the memory device 140. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address, physical media locations, etc.) that are associated with the memory devices 130. The memory sub-system controller 115 can further include host interface circuitry to communicate with the host system 120 via the physical host interface. The host interface circuitry can convert the commands received from the host system into command instructions to access the memory device 130 and/or the memory device 140 as well as convert responses associated with the memory device 130 and/or the memory device 140 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory device 130 and/or the memory device 140.

In some embodiments, the memory device 130 includes local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 can include an adjustment circuitry 113. Although not shown in FIG. 1 so as to not obfuscate the drawings, the adjustment circuitry 113 can include various circuitry to facilitate modifying a trim level based on read operations, write operations, refresh operations, and/or error correction operations performed on a memory device 130, a block of the memory device 130, and/or memory cells coupled to word lines of the memory device. In some embodiments, the adjustment circuitry 113 can include special purpose circuitry in the form of an ASIC, FPGA, state machine, and/or other logic circuitry that can allow the adjustment circuitry 113 to orchestrate and/or perform operations as described herein.

In some embodiments, the memory sub-system controller 115 includes at least a portion of the adjustment circuitry 113. The memory sub-system controller 115 can include a processor 117 (processing device) configured to execute instructions stored in local memory 119 for performing the operations described herein. In some embodiments, the adjustment circuitry 113 is part of the host system 110, an application, or an operating system.

In a non-limiting example, an apparatus (e.g., the computing system 100) can include the adjustment circuitry 113. The adjustment circuitry 113 can be resident on the memory sub-system 110. As used herein, the term "resident on" refers to something that is physically located on a particular component. For example, the adjustment circuitry 113 being "resident on" the memory sub-system 110 refers to a condition in which the hardware circuitry that comprises the adjustment circuitry 113 is physically located on the memory sub-system 110. The term "resident on" can be used interchangeably with other terms such as "deployed on" or "located on," herein.

The adjustment circuitry 113 can be configured to adjust trim levels of the memory devices 130, 140 based on read operations, write operations, refresh operations, and/or error correction operations. As used herein, error correction operations comprise operations utilized to correct errors introduced to data by the reading of the data from memory. For examples, error correction operations can enable the reconstruction of original data stored in memory. The refresh operations can include, operations utilized to read and write data to memory to preserve data stored in the memory.

In various examples, an artificial (AI) system, implemented in the host system 100, the cloud processor 102, and/or the memory sub-system 110, can allow trim levels to be adjusted based on read operations, write operations, refresh operations, and/or error correction operations performed on memory devices 130, 140 to extend the life of the memory devices 130, 140 (e.g., memory cells of blocks and/or word lines). Adjusting the trim levels can negatively impact performance of the memory devices 130, 140 while extending the life of the memory device 130, 140. Adjusting the trim levels can include modifying the program trims to increase the read window budget (RWB) window (e.g., voltage separation between logic levels on NAND flash memory) or lower the RWB.

In various instances, the adjustment circuitry 113 can adjust RWB values based on a quantity of write operations, a quantity of read operations, a quantity of error correction operations, and/or a quantity of refresh operations performed on a block of the memory devices 130, 140. The memory sub-system 110 can provide the quantity of write operations, the quantity of read operations, the quantity of error correction operations, the quantity of refresh operations, and/or a corresponding block identifier to the host 120. The host 120 and/or the cloud processor 102 can utilize the quantity of write operations, the quantity of read operations, the quantity of error correction operations, the quantity of refresh operations, and/or a corresponding block identifier (ID) to determine whether the block having the block ID is likely to be a high read use case (e.g., read dominant). The host 120 and/or the cloud processor 102 can provide said determination to the memory sub-system 110. In various instances, the host memory sub-system 110 can provide an indication that a block is read dominant and a block ID corresponding to the block. The indication can be provided in the form of a flag, for example. The cloud processor 102 can utilize data received from multiple memory sub-systems to identify block that are likely to be read dominant. The host 120 and/or the cloud processor 102 can provide the block IDs of the identified blocks to the multiple memory sub-systems including the memory sub-system 110.

The adjustment circuitry 113 can identify blocks that are read dominant and/or can implement the determination provided by the host 120 and/or the cloud processor 102. Based on identifying read dominant blocks, the adjustment circuitry 113 can adjust the trim levels of corresponding blocks based on whether the quantity of error correction operations and/or the refresh operations are greater than at a corresponding threshold.

As used herein, AI refers to the ability to improve a machine through "learning" such as by storing patterns and/or examples which can be utilized to take actions at a later time. The patterns and/or examples stored and utilized by the cloud processor 102 include the quantity of write operations, the quantity of read operations, the quantity of error correction operations, the quantity of refresh operations, and/or a corresponding block ID. Machine learning refers to a device's ability to learn from data provided as examples. Machine learning can be a subset of AI. As used herein, an artificial neural network (ANN) can provide learning by forming probability weight associations between an input and an output. The probability weight associations can be provided by a plurality of nodes that comprise the ANN. The nodes together with weights, biases, and activation functions can be used to generate an output of the ANN based on the input to the ANN. An ANN can utilize a number of inputs to generate an identifier of blocks that are read dominant.

Figure 2:
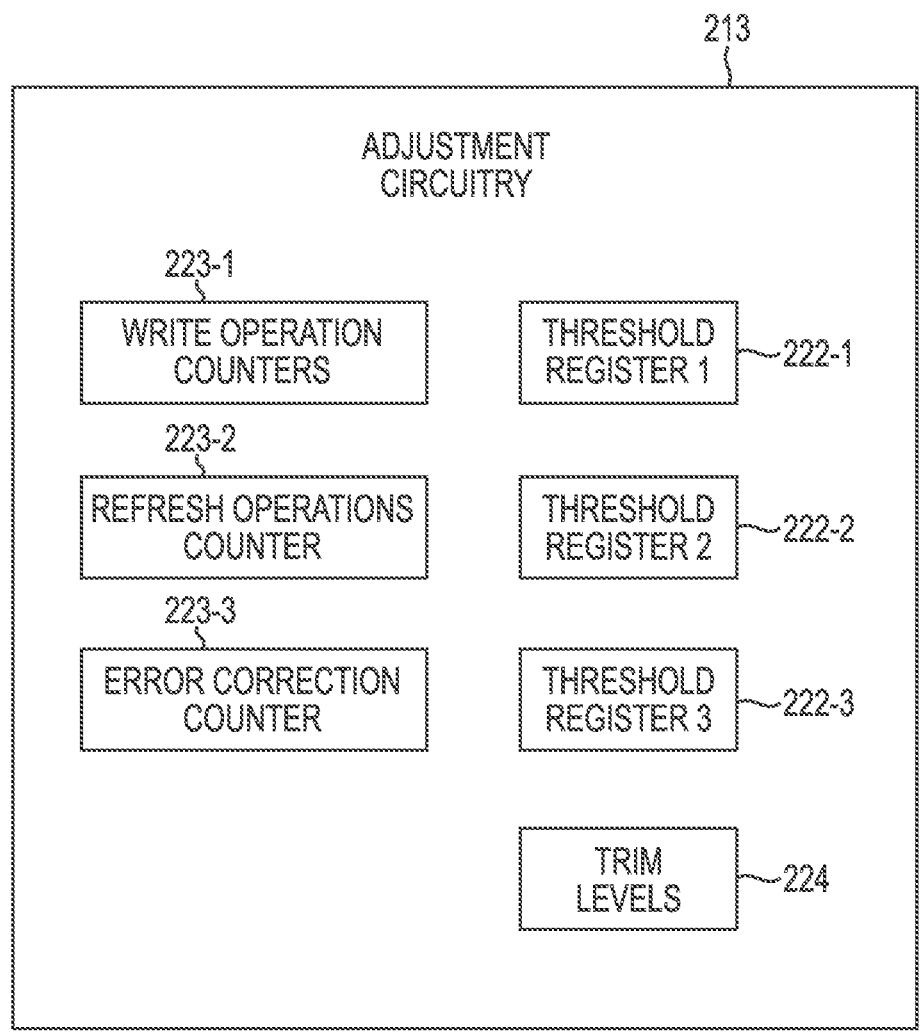
FIG. 2 illustrates a block diagram of example adjustment circuitry in accordance with some embodiments of the present disclosure.

FIG. 2 illustrates a block diagram of example adjustment circuitry 213 in accordance with some embodiments of the present disclosure. The adjustment circuitry 213 can include registers 222-1, 222-2, 222-3, 223-1, 223-2, 223-3, 224. The registers 222-1, 222-2, 222-3 can be referred to as registers 222. The registers 223-1, 223-2, 223-3 can be referred to as registers 223.

The registers 222 can store thresholds. The registers 223 can store counters. The register 224 can store trim levels. For instance, the threshold 222-1 can store threshold values corresponding to the quantity of write operations and/or read operations. The register 222-2 can store a threshold value corresponding to the quantity of refresh operations. The register 222-3 can store a threshold value corresponding to a quantity of error correction operations.

The registers 223-1 can store a quantity of write operations and/or a quantity of read operations. The registers 223-2 can store a quantity of refresh operations. The registers 223-3 can store a quantity of error correction operations. Although, the registers 223-1 are described as storing a quantity of write operations and/or a quantity of read operations, different registers can separately store the quantity of write operations and the quantity of read operations. For example, a first quantity of registers can store a quantity of write operations and a second quantity of registers can store a quantity of read operations. Similarly, the registers 222-1 can separately store a first threshold value corresponding to the quantity of write operations and a second threshold value corresponding to the quantity of read operations.

The registers 224 can store trim level values. For example, the registers 224 can store trim level values that contribute to an RWB.

In various instances, the quantity of write operations and/or the quantity of read operations performed on a block of a memory device can be used by the adjustment circuitry 213 to determine whether the block is read dominant. If the block is read dominant, the quantity of refresh operations stored in the registers 223-2 can be utilized along with a threshold stored in the register 222-2 to determine whether to update the trim levels stored in the registers 224. If the block is read dominant, the quantity of error correction operations stored in the register 223-3 and the threshold stored in the register 222-3 can be used by the adjustment circuitry 213 to update the trim levels stored in the registers 224.

Figure 3A:
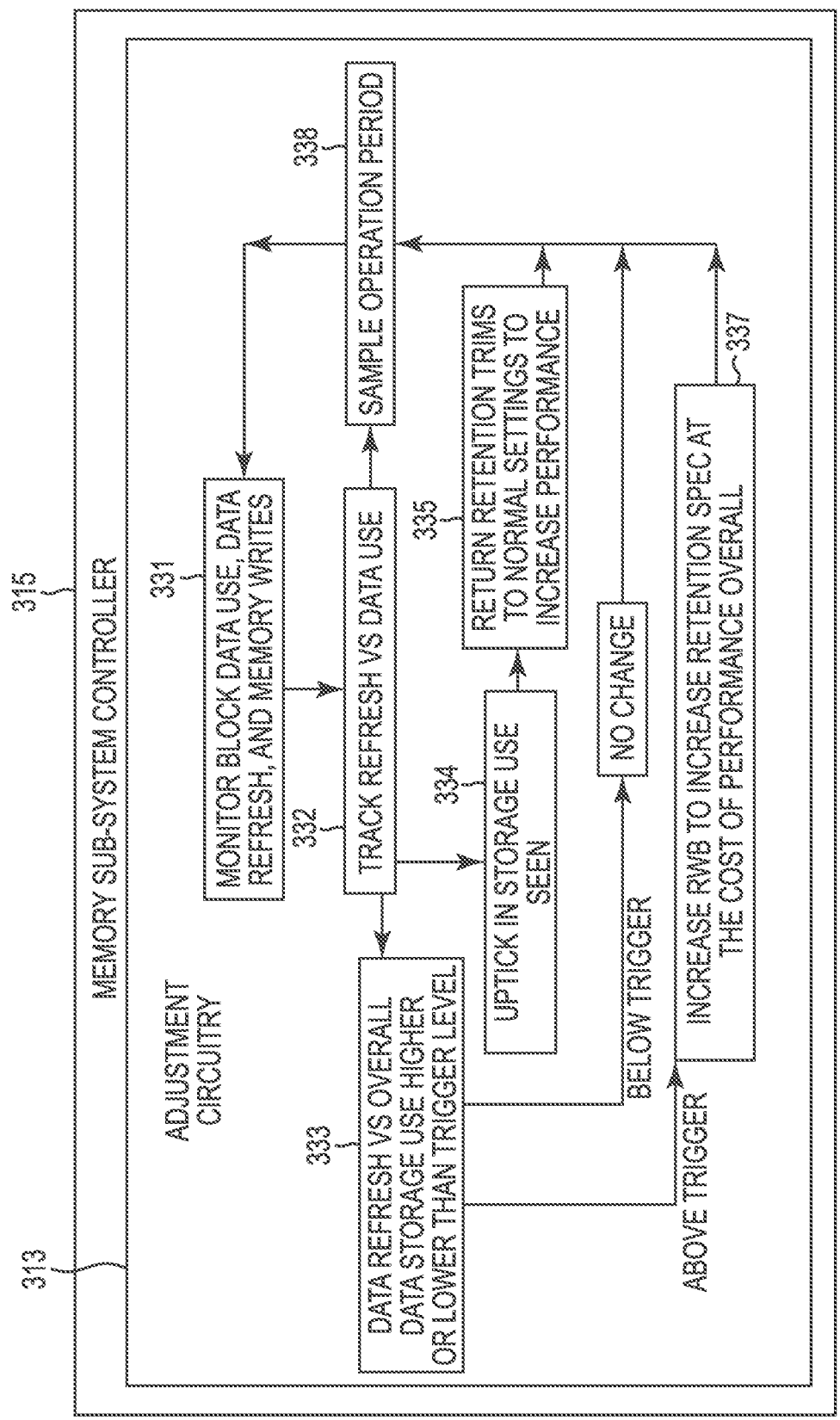
FIG. 3A is a flow diagram corresponding to adjustment circuitry in accordance with some embodiments of the present disclosure.
Figure 3B:
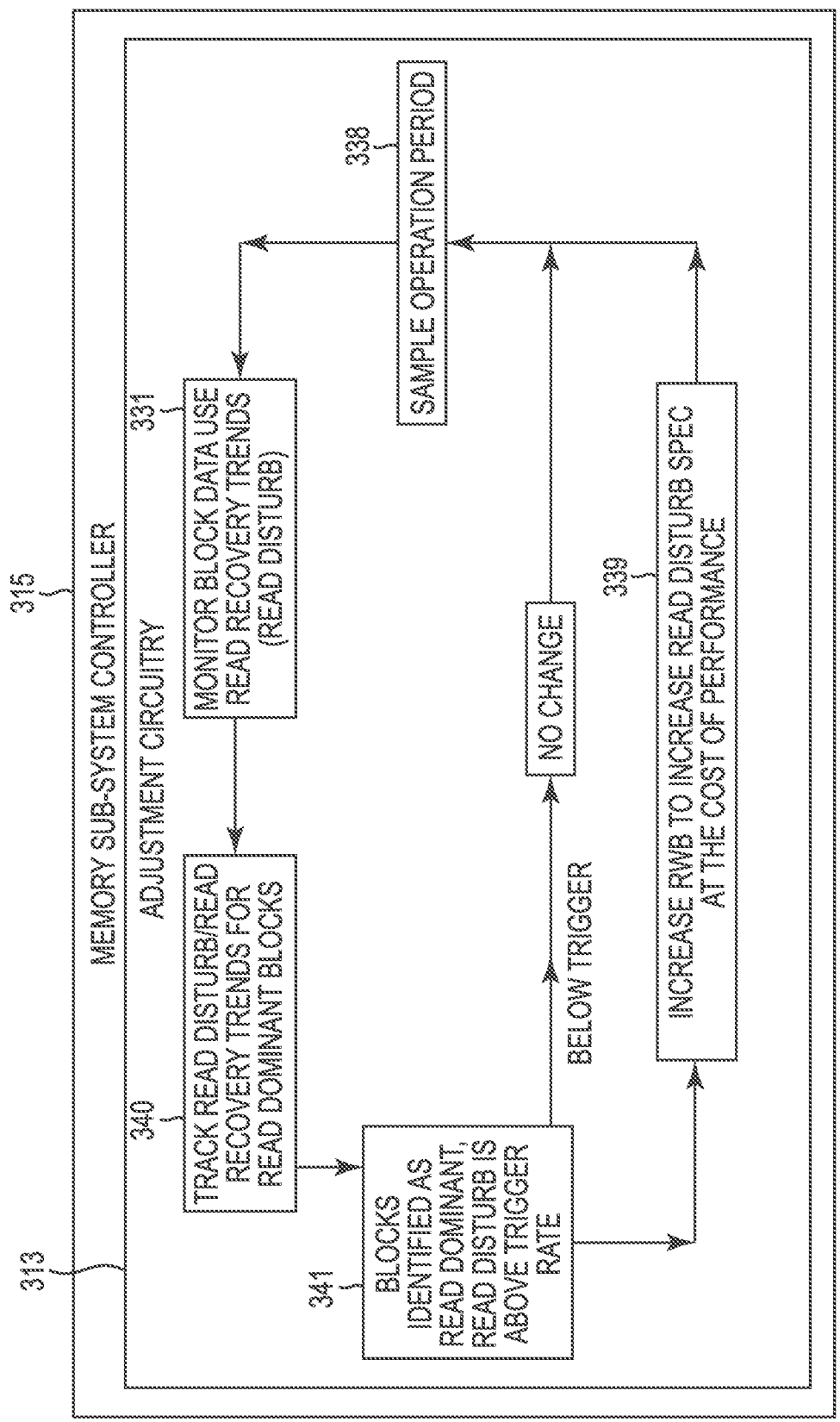
FIG. 3B is a flow diagram corresponding to adjustment circuitry in accordance with some embodiments of the present disclosure.

In various instances, a use of the quantity of error correction operations to update the trim levels and a use of the quantity of refresh operation to update the trim levels can be independent from one another. For example, the quantity of refresh operations can be utilized to update the trim levels without utilizing the quantity of error correction operations as shown in FIG. 3A. The quantity of error correction operations can be utilized to update the trim levels without utilizing the quantity of refresh operations as shown in FIG. 3B. The quantity of error correction operations and the quantity of refresh operations can also be utilized concurrently to update the trim levels as shown in FIG. 3C.

Figure 3C:
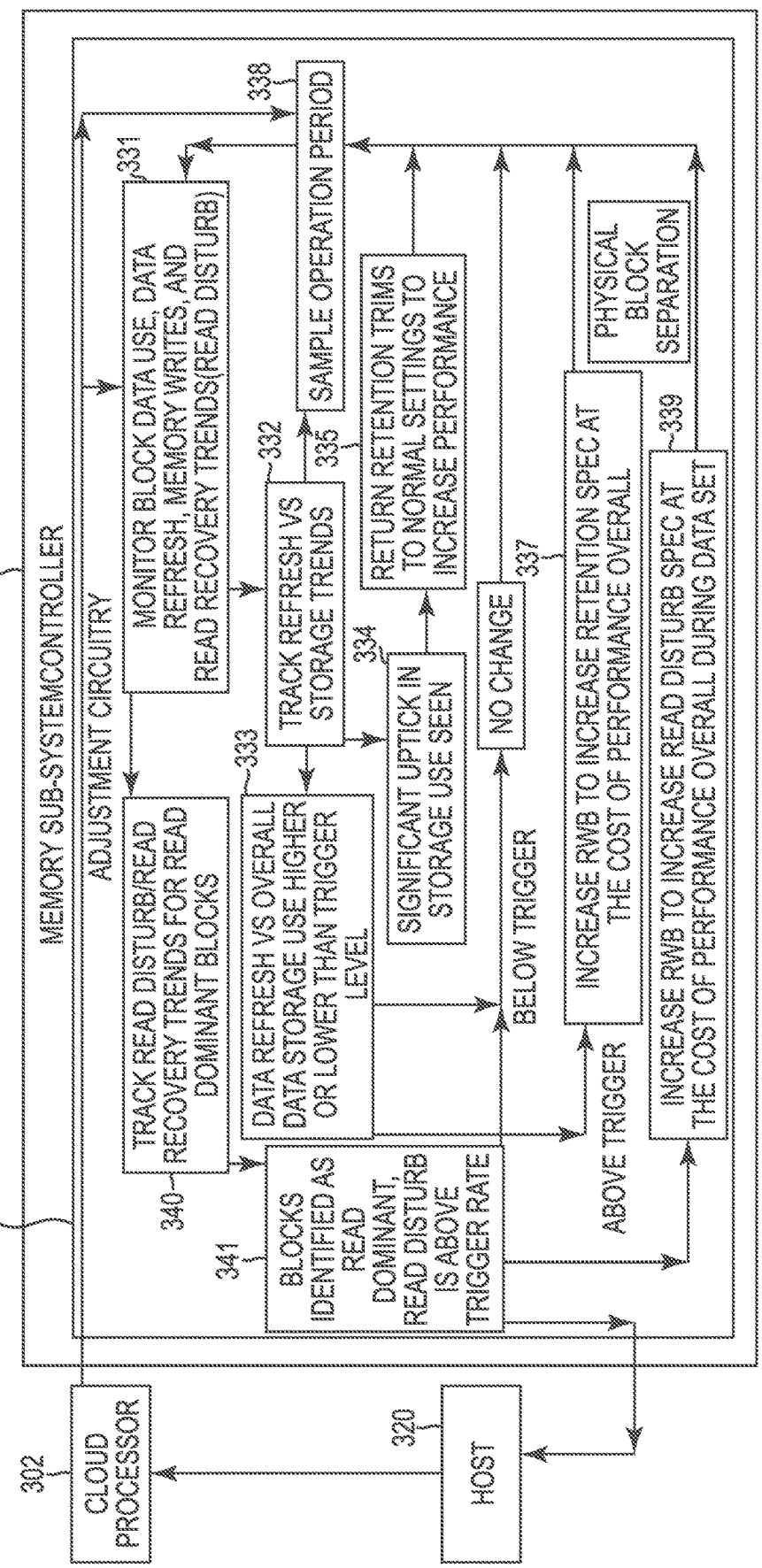
FIG. 3C is a flow diagram corresponding to adjustment circuitry in accordance with some embodiments of the present disclosure.

FIGS. 3A, 3B, 3C are a flow diagrams corresponding to adjustment circuitry 313 in accordance with some embodiments of the present disclosure. FIG. 3C combines the flow diagrams shown in FIGS. 3A, 3B. FIGS. 3A, 3B, 3C show a memory sub-system controller 315 as comprising the adjustment circuitry 313. The adjustment circuitry 313 is shown as performing the flow diagram shown.

FIG. 3A shows a flow diagram for determining whether to adjust trim levels (e.g., trim levels stored in trim level registers 224 of FIG. 2) of memory devices. At operation 331, the adjustment circuitry 331 can monitor a data use, data refresh operations, and/or write operations performed on a block of a memory device. The data use, data fresh operations, and/or write operations can be quantified at operation 331 over a period 338. The period 338 can be a duration of time over which operations are sampled. As used herein, data use of a block of a memory device can be quantified as the quantity of read operations, write operations, error correction operations, and/or refresh operations performed on the block of the memory device. The read operations, the write operations, error correction operations, and/or the data refresh operations can be quantified using the registers 223-1, 223-2, 223-3 of FIG. 2.

At operation 332, the data use and the refresh operations can be tracked. A tracking of the data use and the refresh operations can be performed in two stages. The data use can be used to determine whether to continue to operations 333, 334. The data use can be used to determine whether a block of data is read dominant. If the block is not read dominant, then operation 331 can be performed during the period 338. If the block is read dominant, then operations 333, 334 can be performed. To determine whether the data use indicates that the block of data is read dominant, the adjustment circuitry 313 can compare the quantity of read operations to the quantity of write operations. Different standards can be used to identify read dominance. For example, read dominance can be identified if the quantity of read operations are greater than the quantity of write operations. Read dominance can be identified if the quantity of read operations is a multiple of the quantity of write operations. For instance, read dominance can be identified if there are twice as many read operations performed on a block of memory as there are write operations over the period 338, although other multiples can be utilized. Read dominance can also be identified if the quantity of read operations is greater than a first threshold and/or the quantity of write operations is less than a second threshold, the first threshold being greater than the second threshold.

At operation 333, a determination can be made as to whether the quantity of refresh operations is greater than a threshold (e.g., a threshold stored in register 222-2 in FIG. 2) for a block that is read dominant. If the quantity of refresh operations is less than the threshold (e.g., below the threshold), then no change can be made to the trim levels. For example, the adjustment circuitry 313 can refrain from adjusting the trim levels of a block of a memory device if the quantity of refresh operations is less than the threshold. If the quantity of refresh operations is greater than the threshold, then the trim levels can be adjusted at operation 337. At operation 333, a determination can be made to modify the trim levels based on the quantity of refresh operations. If the quantity of refresh operations is greater than the threshold, then too many refresh operations are being performed on blocks that are read dominant to retain the data in the memory cells of the block which results in a reduced life of the block. Read dominant blocks may need less refresh operations, than blocks that are not read dominant, to store data.

Modifying the trim levels of the block can include increasing the RWB of the block. Increasing the RWB of the block can increase a retention specification, at a cost of performance, of the block. Increasing the retention specification can decrease the quantity of refresh operations performed over the period 338. The data can be retained for a longer period of time during refresh operations based on the increase to the retention specification.

At operation 334, a determination can be made as to whether an uptick in data use is seen. An uptick in data use can describe whether a block is being read and/or written to more often than in previous periods. For example, data can be used more often if the quantity of write commands increased in the period 338 as compared to previous periods. An increase in write commands to the block can indicate that more resources are needed to execute the write commands. For instance, a decreased RWB may be desirable in view of the increase in write commands. The increase in the quantity of write commands may be compared to a threshold. If the increase in the quantity of write commands is greater than the threshold, then a determination can be made that there is an uptick in data use. If a determination is made indicating that there is an increase in data use, then the operations 335 can be performed. If a determination is made indicating that there is no increase in data use, then the operation 331 can be performed over a next period.

To determine whether there is an increase in data use, the quantity of write operations to the block can be monitored and tracked over multiple periods 338. For example, registers (not shown in FIG. 2) can be utilized to store the threshold and/or the quantity of write operations over multiple periods.

At operation 335, the trim levels can be returned to a normal setting to increase performance. A normal setting can describe, for example, a default setting of the trim settings. In various instances, a normal setting can describe a decrease in the trim settings such that the RWB is decreased by a predetermined amount which can be different from the amount by which the RWB is increased at operation 337. Returning the trim levels to a normal setting can increase performance due to the shortening of the RWB which can cause a utilization of more refresh operations as compared to a use of a longer RWB.

FIG. 3B shows operations 331 monitoring block data use and read recovery trends. A data use of a block can be represented by the quantity of read operations, write operations, error correction operations, and/or refresh operations performed on the block of the memory device. Monitoring the block data use can include counting the quantity of read operations, write operations, error correction operations, and/or refresh operations performed on the block of the memory device performed during the period 338 for the block.

At operation 340, a determination can be made as to whether a block of data is read dominant. If a block is read dominant (e.g., high read rates blocks), then the read disturb and read recovery trends can be tracked at operation 340. The adjustment circuitry 313 can track the read disturb and read recovery trends by tracking the error correction operations performed on blocks that are read dominant. As used herein, read disturb describes the disturbance of a threshold voltage of an unread memory cell due to the reading of a memory cell which is in a different row of a same block of a memory device. Memory cells that have a disturbed threshold voltage can be incorrectly read such that error correction is performed on the read data. If a block is not read dominant, then the operations 331 can continue to count read operations, write operations, and/or error correction operations over a next period. If a block is read dominant, then the operation 341 can be performed.

Read disturb errors and read recovery trends are related in that read disturb errors are corrected or recovered using error correction operations. Error correction operations are examples of read recover trends. The error correction operations can describe operations performed using an ECC, for example. A count of the quantity of error correction operations performed on a block of the memory device can signal a quantity of read disturb errors experienced during a quantity of read operations performed on the block during the period 338, the block being read dominant.

At operation 341, for blocks identified as read dominant, a determination can be made as to whether the quantity of error correction operations performed on the blocks is greater than a threshold (e.g., trigger rate). For instance, a determination can be made as to whether the quantity of error correction operations performed for a read dominant block is greater than a corresponding threshold. If the quantity of error correction operations is not greater than the threshold, then the adjustment circuitry 313 can refrain from modifying the trim levels of the block(s). For example, the adjustment circuitry 313 can refrain from modifying an RWB if the quantity of error correction operations is less than the threshold. If the quantity of error correction operations is greater than the threshold, then the operation 339 can be performed.

A determination can also be made to determine whether an error correction rate is greater than the threshold (e.g., trigger rate). The error correction rate can be generated from the first quantity of read operations and the second quantity of error correction operations performed on a block. For example, the error correction rate can be generated by dividing the error correction operations by the quantity of read operations, the quantity of write operations, and/or or quantity of bits read or written from the block. The error correction rate can be compared to the threshold which can also be referred to as a trigger rate or a rate threshold.

At operation 339, the trim levels of the block(s) can be modified. As previously described, modifying the trim levels can include modifying the RWB by increasing the RWB. Although modifying the trim levels is described as including modifying the RWB the RWB can be modified responsive to the modifying the trim levels. Increasing the RWB can increase a read disturb specification at the cost over performance for the block(s). Increasing the read disturb specification can include increasing the RWB such that more read disturb failures are experiences. Increasing the number of read disturb failure experienced can include lengthening the duration between performing refresh operations. Increasing the read disturb failures can also decrease performance of the block. During a next period 338, the operation 331 can be performed.

FIG. 3C combines the elements of FIG. 3A and FIG. 3B. Operation 331 combines operation 331 of FIG. 3A and operation 331 of FIG. 3B. At operation 331, the block data use, the refresh operation, the write operations, and/or the error correction operations can be monitored. Monitoring the block data use, the refresh operation, the write operations, and the error correction operations can include counting read operations, write operations, refresh operations, and/or error correction operations using one or more registers.

Operations 332, 333, 334, 335, 337, 339, 340, and 341 can be performed as described in FIGS. 3A and 3B. Modifying the trim levels as described at operations 337 and 339 can include providing physical block separation. Physical block separation can include a providing padding blocks adjacent to a block that has its trim levels modified. For instance, if a first block has its trim levels modified, then a second block and a third block adjacent to the first block can be reserved such that no data is stored in the second block and the third block. The second block and the third block can be vacated prior to being reserved as padding blocks for the first block. Vacating the padding blocks can include deleting the data stored in the padding blocks and/or moving the data stored in the padding blocks to blocks that are not adjacent to the first block. The padding blocks can be utilized so that the modified trim setting of a block does not interact with the trim settings of other blocks. The adjustment circuitry 313 can cause the adjacent blocks to be reserved as padding blocks. Providing physical block separation can also include refrain from implementing write operations to the padding blocks.

At block 341, responsive to identifying a block as being read dominant and determining that the quantity of error correction operations is greater than a threshold, data can be provided to a host. For example, the quantity of write operations, the quantity of read operations, the quantity of error correction operations, the quantity of refresh operations, and an ID of one or move blocks can be provided to a host. The block ID can correspond to blocks that are identified as read dominant blocks at block 340. At operation 320, the host forward the quantity of write operations, the quantity of read operations, the quantity of error correction operations, the quantity of refresh operations, and an ID of one or move blocks to a cloud processor. In various instances, a cloud processor can be a processing device implemented in a cloud system. For example, the cloud processor can be an AI accelerator such as a deep learning accelerator, among other types of processors that can be implemented in a cloud system. The cloud processor can be utilized to implement an ANN or other learning processes, for example.

In various instances, the adjustment circuitry 313 can provide a block ID and a flag identifying a corresponding block as being read dominant to the host. At operation 320, the host can forward the quantity of write operations, the quantity of read operations, the quantity of error correction operations, the quantity of refresh operations, and an ID of one or move blocks to the cloud processor. The host can also forward the flag and the block ID to the cloud processor.

At operation 302, the cloud processor can receive data from multiple different hosts. The cloud processor can utilize the data to identify blocks of different memory devices that are likely to be read dominant based on the quantity of write operations, the quantity of read operations, the quantity of error correction operations, the quantity of refresh operations, an ID of one or more blocks, and/or flags received from different hosts.

For example, the cloud processor can implement an artificial neural network (ANN), among other types of machine learning operations that can be performed by the cloud processor. In various instances, the quantity of write operations, the quantity of read operations, the quantity of error correction operations, the quantity of refresh operations, and/or an ID of one or move blocks received by the cloud processor from a plurality of memory sub-systems can be utilized to train the ANN. That is, the quantity of write operations, the quantity of read operations, the quantity of error correction operations, the quantity of refresh operations, and/or an ID of one or move blocks corresponding to a plurality of memory sub-systems received by the cloud processor can be utilized by the cloud processor to generate weights and/or biases corresponding to the ANN; thereby training the ANN.

The cloud processor can then receive a quantity of write operations, a quantity of read operations, a quantity of error correction operations, a quantity of refresh operations, and/or an ID of one or move blocks corresponding a memory sub-system. The cloud processor can provide the quantity of write operations, the quantity of read operations, the quantity of error correction operations, the quantity of refresh operations, and/or an ID of one or move blocks as inputs to the ANN. The ANN can process the inputs utilizing a plurality of nodes organized in layers, the weights, and the biases to generate an output. The output generated by the ANN can be a block ID corresponding to a block of the memory sub-system that is expected to be read dominant. At operation 302, the host can provide the block IDs of the identified blocks to the memory sub-systems 315.

The data received from the cloud processor can be utilized by the adjustment circuitry 313 to determine whether blocks are likely to be read dominant. At operations 340 and 332, the block IDs received from the cloud processor can be utilized to identify blocks that are read dominant. For example, a block that is not read dominant but is close to being read dominant can be identified as read dominant based on the block IDs received from the cloud processor if the block ID of the block that is not read dominant is included in the block ID's received from the cloud processor.

The data received form the cloud processor can be in the form of a flag. The flag can identify the block ID as likely being read dominant. The cloud processor can receive block ID from a plurality of hosts and/or memory sub-systems. The cloud processor can utilize a knowledge of the architecture of a plurality of memory sub-systems to identify blocks in a first memory sub-system as likely being read dominant based on the identification of a corresponding block in a second memory sub-system as being read dominant.

Figure 4:
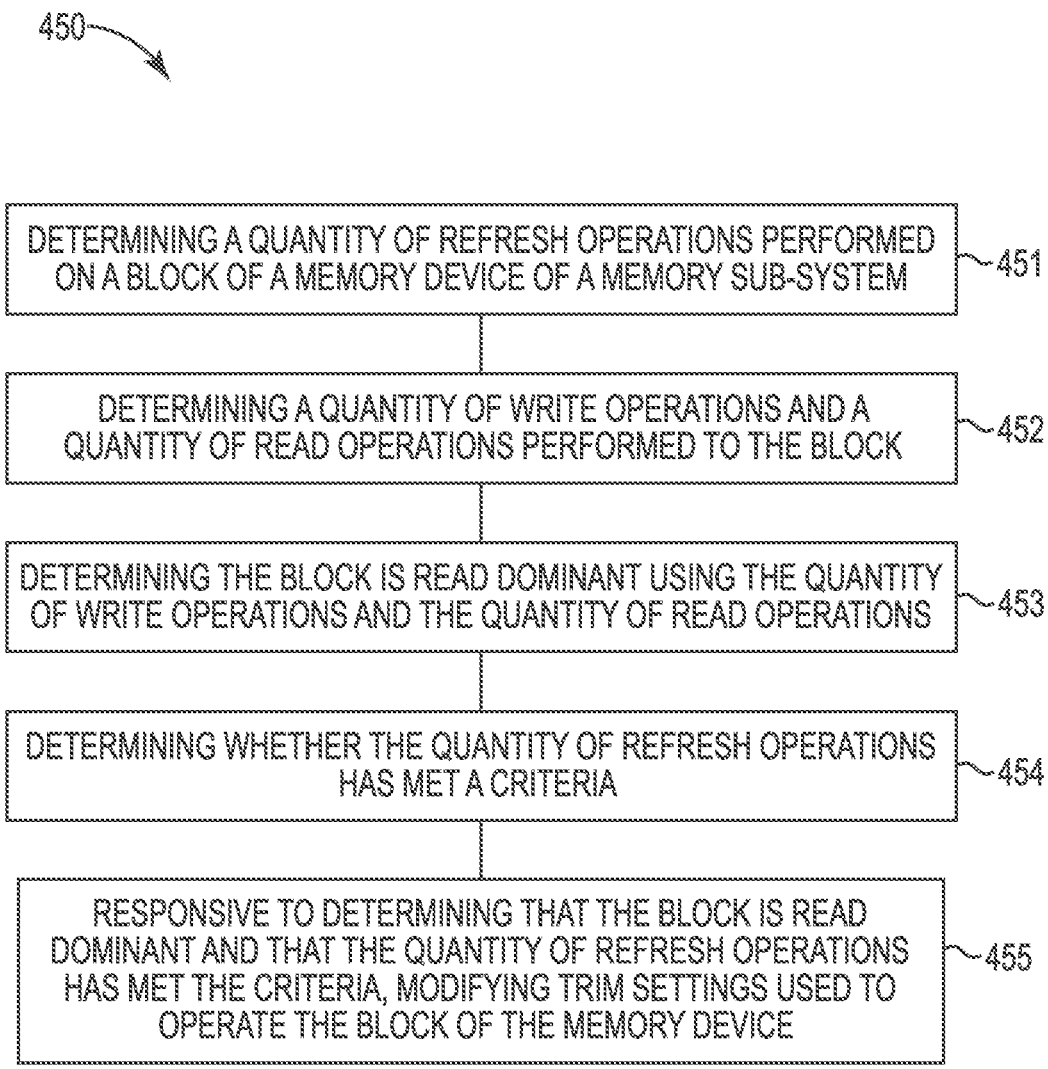
FIG. 4 is a flow diagram corresponding to a method for trim level adjustments in memory in accordance with some embodiments of the present disclosure.

FIG. 4 is a flow diagram corresponding to a method 450 for trim level adjustments in memory in accordance with some embodiments of the present disclosure. The method 441 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof In some embodiments, the method 450 is performed by the adjustment circuitry 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 451, a quantity of refresh operations performed on a block of a memory device of a memory sub-system can be determined. Determining the quantity of refresh operations can include counting the quantity of times a block of the memory device is refreshed over a period of time. Refreshing a block can be described as performing refresh operation on the block. At operation 452, a quantity of write operations and a quantity of read operations performed to the block can be determined. Determining the quantity of write operation and the quantity of read operations performed to the block can include counting the quantity of writes and the quantity of reads to the block. At operation 453, a determination can be made that the block is read dominant using the quantity of write operations and the quantity of read operations. Read dominant can describe a block that is written to infrequently and read frequently.

At operation 454, a determination can be made as to whether the quantity of refresh operations has met a criteria. The determination of whether the quantity of refresh operations has met a criteria can be utilized to determine whether to modify trim settings. For example, at operation 455, responsive to determining that the block is read dominant and that the quantity of refresh operations has met the criteria, the trim settings used to operate the block of the memory device can be modified. Responsive to determining that the block is read dominant and that the quantity of refresh operations has not met the criteria, the trim settings used to operate the block of the memory device may not be modified. For instance, a processing device can refrain from modifying the trim setting responsive to determining that the block is read dominant and that the quantity of refresh operations has not met the criteria. Responsive to determining that the block is not read dominant, the trim settings used to operate the block of the memory device may not be modified.

Modifying the trim settings can include modifying a RWB corresponding to the block of the memory device. Modifying the RWB corresponding to the block can further include increasing the RWB corresponding to the block. Modifying the trim settings can also include increasing the retention specification of the block.

In various instances, the quantity of refresh operations that are performed on the block of the memory device of the memory sub-system and the quantity of write operations that are performed on the block can be determined during a sample operation period. Responsive to determining that the quantity of write operations performed in the sample period is greater than a quantity of write operations performed in a previous sample period by more than a particular amount, the trim settings used to operate the block can be set to default trim settings. A default trim setting can be a trim setting before the trim setting is modified. The sample operating period can be a period spanning a first refresh operation and a second refresh operation. The quantity of refresh operations and the quantity of write operation, that are determined, can span a period from a first refresh operation to a second refresh operation, for example.

In various instances, a processing device coupled to the memory device can be configured to determine a quantity of write operations and a quantity of read operations performed on a block of the memory device and can also be configured to determine a quantity of error correction operations performed on the block. A determination can also be made as to whether the block is read dominant based on comparing the quantity of write operations to the quantity of read operations. Comparing the quantity of write operations to the quantity of read operations can include determining whether one is larger than the other. The quantity of write operations and the quantity of read operations can also be compared relative to a threshold. For example, a determination can be made as to whether the quantity of write operations is greater than a threshold but the quantity of read operations is not greater than the threshold. A determination can also be made as to whether the quantity of write operations is not greater than a threshold but the quantity of read operations is greater than the threshold.

The processing device can also determine whether an error correction rate generated from the quantity of write operations and the quantity of error correction operations has met a criteria. Responsive to determining that the block is read dominant and that the error correction rate has met the criteria, the trim settings used to operate the block of the memory device can be modified. Responsive to determining that the block is read dominant and that the error correction rate has met the criteria, the trim settings used to operate the block of the memory device may not be modified. Responsive to determining that the block is not read dominant, the trim settings used to operate the block of the memory device may not be modified.

Modifying the trim setting can also include modifying a RWB of the block of the memory device. Modify the trim settings can also include modifying a read disturb specification of the block.

In various instances, additional blocks adjacent to the block of the memory device can be vacated. Vacating a block can include moving data from the block to a different block. Vacating can also include deleting data from the block after the data is moved. A processing device can also refrain from implementing write operation to the additional block responsive to vacating the block.

A processing device coupled to the memory device can determine a quantity of write operations and a quantity of read operations performed on a block of the memory device. An error correction rate generated from the quantity of write operations and a quantity of error correction operations performed on data read from the block can also be determined. A quantity of refresh operations performed on the block can further be determined. Responsive to determining that the block is read dominant based on the quantity of write operations and the quantity of read operations and responsive to determining that the error correction rate is greater than a first threshold or that the quantity of refresh operations is greater than a second threshold, a trim setting used to operate the lock can be adjusted in order to increase a RWB corresponding to the block.

Responsive to determining that the block is read dominant or responsive to determining that the error correction rate is less than the first threshold and the quantity of refresh operations is less than the second threshold, the trim setting may not be adjusted. The trim settings may not be adjusted in order to refrain from increasing the RWB.

The processing device can also provide an identifier of the block of the memory device to a host coupled to the apparatus, wherein the host provides the identifier of the block to a cloud system. The cloud system can receive identifiers of blocks, of various memory devices, that are read dominant. The cloud system can perform machine learning to identify block that are expected to be read dominant. For example, the cloud system can implement a ANN that receives as an input a block ID and generate a classification such as read dominant or non-read dominant. In various instances, the cloud system can provide a flag identifying the block having the block ID as read dominant. For example, the processing device can receive the ID of the block and the flag identifying the bock as read dominant. The processing device can further, responsive to receipt of the flag and the identifier of the block and responsive to determining that the error correction rate is greater than the first threshold or the quantity of refresh operations is greater than the second threshold, adjust the trim setting in order to increase the RWB.

Figure 5:
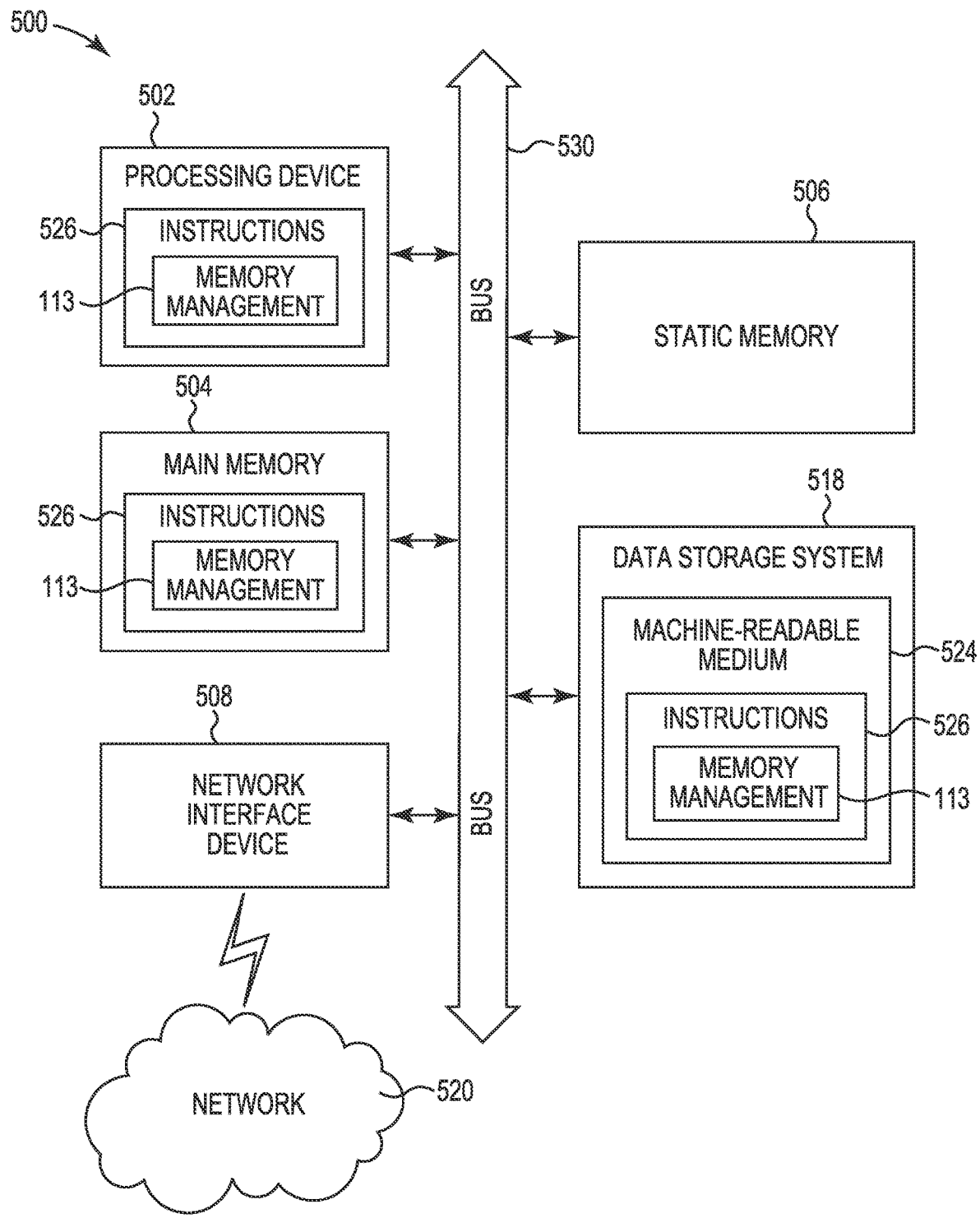
FIG. 5 is a block diagram of an example computer system in which embodiments of the present disclosure may operate.

FIG. 5 is a block diagram of an example computer system 500 in which embodiments of the present disclosure may operate. For example, FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the adjustment circuitry 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage system 518, which communicate with each other via a bus 530.

The processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory sub-system 110 of FIG. 1.

In one embodiment, the instructions 526 include instructions to implement functionality corresponding to adjusting trim levels (e.g., the adjustment circuitry 113 of FIG. 1). While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method, comprising:
   determining a quantity of refresh operations performed on a block of a memory device of a memory sub-system;
   determining a quantity of write operations and a quantity of read operations performed to the block;
   determining the block is read dominant using the quantity of write operations and the quantity of read operations;
   determining whether the quantity of refresh operations has met a criteria; and responsive to determining that the block is read dominant and that the quantity of refresh operations has met the criteria, modifying trim settings used to operate the block of the memory device.

2. The method of claim 1, further comprising, responsive to determining that the block is read dominant and that the quantity of refresh operations has not met the criteria, refraining from modifying the trim settings used to operate the block of the memory device.

3. The method of claim 1, further comprising, responsive to determining that the block is not read dominant, refraining from modifying the trim settings used to operate the block of the memory device.

4. The method of claim 1, wherein modifying the trim settings further comprises modifying a read window budget (RWB) corresponding to the block of the memory device.

5. The method of claim 4, wherein modifying the RWB corresponding to the block further comprises increasing the RWB corresponding to the block.

6. The method of claim 1, wherein modifying the trim settings further comprises increasing the retention specification of the block.

7. The method of claim 1, further comprising determining the quantity of refresh operations that are performed on the block of the memory device of the memory sub-system and the quantity of write operations that are performed on the block during a sample operation period.

8. The method of claim 7, further comprising, responsive to determining that the quantity of write operations performed in the sample period is greater than a quantity of write operations performed in a previous sample period by more than a particular amount, setting the trim settings used to operate the block to default trim settings.

9. The method of claim 1, further comprising determining the quantity of refresh operations and the quantity of write operation span a sample period comprising a first refresh operation and a second refresh operation.

10. An apparatus, comprising:
a memory device;
a processing device coupled to the memory device and configured to:
determine a quantity of write operations and a quantity of read operations performed on a block of the memory device;
determine a quantity of error correction operations performed on the block;
determine whether the block is read dominant based on comparing the quantity of write operations to the quantity of read operations;
determine whether an error correction rate generated from the quantity of write operations and the quantity of error correction operations has met a criteria; and
responsive to determining that the block is read dominant and that the error correction rate has met the criteria, modify trim settings used to operate the block of the memory device.

11. The apparatus of claim 10, wherein the processing device is further configured to, responsive to determining that the block is read dominant and that the error correction rate has met the criteria, refrain from modifying the trim settings used to operate the block of the memory device.

12. The apparatus of claim 10, wherein the processing device is further configured to, responsive to determining that the block is not read dominant, refrain from modifying the trim settings used to operate the block of the memory device.

13. The apparatus of claim 10, wherein the processing device configured to modify the trim settings is further configured to modify a read window budget (RWB) of the block of the memory device.

14. The apparatus of claim 10, wherein processing device configured to modify the trim settings is further configured to modify a read disturb specification of the block.

15. The apparatus of claim 10, wherein the processing device is further configured to vacate additional blocks adjacent to the block of the memory device.

16. The apparatus of claim 15, wherein the processing device is further configured to refrain from implementing write operations to the additional blocks.

17. An apparatus, comprising:
a memory device;
a processing device coupled to the memory device and configured to:
determine a quantity of write operations and a quantity of read operations performed on a block of the memory device;
determine an error correction rate generated from the quantity of write operations and a quantity of error correction operations performed on data read from the block;
determine a quantity of refresh operations performed on the block; and
responsive to determining that the block is read dominant based on the quantity of write operations and the quantity of read operations, and determining that the error correction rate is greater than a first threshold or the quantity of refresh operations is greater than a second threshold, adjusting trim settings used to operate the block in order to increase a read window budget (RWB) corresponding to the block.

18. The apparatus of claim 17, wherein the processing device is further configured to:
responsive to determining that the block is read dominant or responsive to determining that the error correction rate is less than the first threshold and the quantity of refresh operations is less than the second threshold, refrain from adjusting the trim setting in order to refrain from increasing the RWB.

19. The apparatus of claim 17, wherein the processing device is further configured to:
provide an identifier of the block of the memory device to a host coupled to the apparatus, wherein the host provides the identifier of the block to a cloud system.

20. The apparatus of claim 19, wherein the processing device is further configured to receive the identifier of the block and a flag identifying the block as read dominant.

21. The apparatus of claim 20, wherein the processing device is further configured to, responsive to receipt of the flag and the identifier of the block and responsive to determining that the error correction rate is greater than the first threshold or the quantity of refresh operations is greater than the second threshold, adjust the trim setting in order to increase the RWB.

22. The apparatus of claim 20, wherein the processing device is further configured to receive the identifier of the block and the flag from the cloud system.

23. The apparatus of claim 22, wherein the processing device is further configured to receive the identifier of the block and the flag from the cloud system that utilized an artificial neural network to generate the flag.

24. The apparatus of claim 22, wherein the processing device is further configured to receive the identifier of the block and the flag from the cloud system that utilized the artificial neural network, the identifier of the block provided from the apparatus, and a plurality of different identifiers of different blocks of different apparatuses.

\* \* \* \* \*